United States Patent [19]

Okumura et al.

[11] Patent Number: 4,954,218
[45] Date of Patent: Sep. 4, 1990

[54] METHOD FOR ETCHING A PATTERN

[75] Inventors: Katsuya Okumura; Tohru Watanabe; Masami Watase, all of Kanagawa, Japan

[73] Assignee: Kabushiki Kaisha Toshiba, Kanagawa, Japan

[21] Appl. No.: 389,681

[22] Filed: Aug. 4, 1989

[30] Foreign Application Priority Data

Sep. 8, 1988 [JP] Japan .................. 63-233503

[51] Int. Cl.⁵ .................. B44C 1/22; C03C 15/00; C03C 25/06; C23F 1/02
[52] U.S. Cl. .................. 156/643; 156/646; 156/653; 156/656; 156/657; 156/659.1; 357/65; 437/200; 437/203

[58] Field of Search .............. 156/643, 646, 652, 653, 156/656, 657, 659.1, 661.1, 662, 663, 665; 204/192.32, 192.35, 192.37; 437/186, 187, 189, 200, 203, 228; 357/65, 67, 71

[56] References Cited

U.S. PATENT DOCUMENTS 4,261,792 4/1981 Tsuji et al. .................. 156/665 X
4,496,419 1/1985 Nulman et al. .................. 156/656 X Primary Examiner—William A. Powell
Attorney, Agent, or Firm—Finnegan, Henderson, Farabow, Garrett and Dunner

[57] ABSTRACT

A photoresist layer having a prescribed pattern is formed on a substrate to be etched. The substrate is immersed into a predetermined solution to form a layer on the substrate except on those portions where the photoresist layer is formed. The photoresist layer is removed, and the substrate is etched using the remaining layer as a mask.

7 Claims, 3 Drawing Sheets

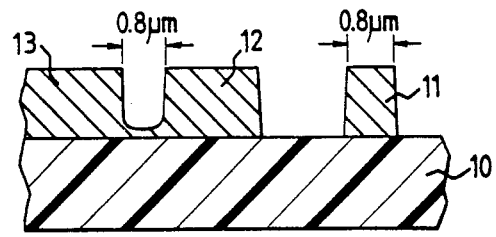
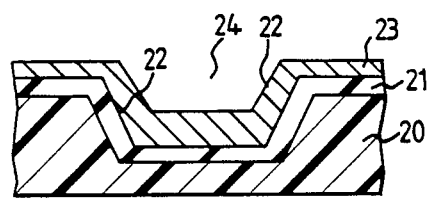
FIG.1 PRIOR ART    FIG.2A
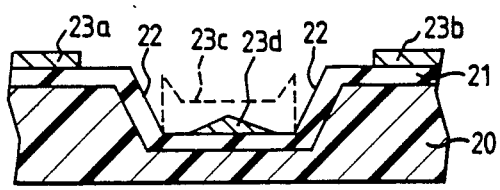
FIG.2B PRIOR ART
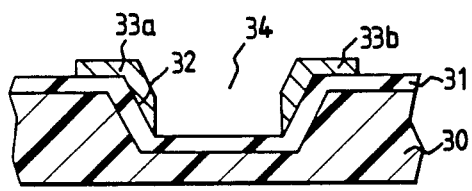
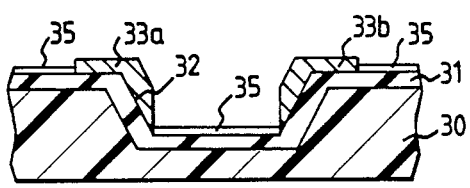
FIG.3A    FIG.3B
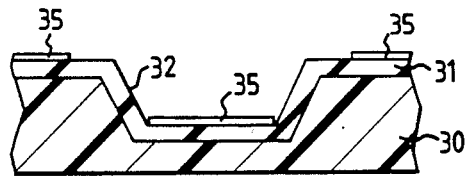
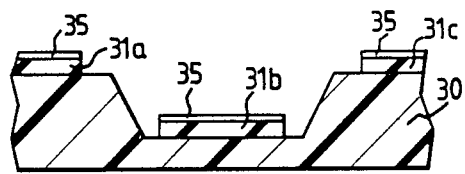
FIG.3C    FIG.3D

METHOD FOR ETCHING A PATTERN

BACKGROUND OF THE INVENTION

1. Field of the Invention

This invention concerns a method for forming a prescribed pattern of, e.g., a wiring layer by etching, on a semiconductor device.

2. Description of the Prior Art

Conventionally, for etching a semiconductor substrate, a Reactive Ion Etching (RIE) is utilized using a photoresist pattern formed on the semiconductor substrate as a mask.

FIG. 1 is a diagram for explaining a problem which is present in a conventional process for forming a pattern of submicron dimensions using a conventional exposure and development technique. Namely, in the case where the width between the adjacent pattern is relatively wide, e.g. 1.0 μm, a desired pattern may be obtained by the conventional technique. However, in the case where the width is 0.8 μm (e.g., between the photoresist pattern 12 and 13), some undeveloped photoresist remains on the substrate 10, since the bottom portion of the photoresist is not sufficiently exposed even if the upper portion is clearly patterned. Thus, it is difficult to use the photoresist pattern 12 and 13 as a mask in a subsequent etching process.

FIGS. 2A and 2B are diagrams for explaining a problem in a conventional process for forming a prescribed pattern of a high reflective metal layer 21 in a recessed portion 24 of a semiconductor substrate 20. In the conventional process, a material of high reflectivity, such as a tungsten silicide 21, is formed. A photoresist layer 23 is then formed thereon. (FIG. 2A) Next, an exposure and a development are carried out to form a photoresist pattern 23a and 23b. By this process, a desired pattern 23a and 23b of photoresist may be formed on a flat surface of the substrate 20. However, at the level difference portion 24, the reflected light from the angled surface 22 of the metal layer 21 exposes the photoresist 23 in the recess. Thus, the desired pattern illustrated by the dotted line 23c can not be obtained, and a photoresist pattern 23d may result instead. Therefore, it is also difficult to use the pattern 23d as a mask to etch the metal layer 21 accurately.

SUMMARY OF THE INVENTION

Therefore, an object of the present invention is to provide an improved method which results in a desired accurate photoresist pattern, even if the width between the adjacent portion of the ppattern is of the submicron order.

To achieve the object, this invention provides a method for forming a perscribed pattern, comprising the steps of: preparing a substrate having a first main surface; forming a first layer on the first main surface; forming a second layer on the first layer; selectively removing the second alyer to form a first patterned layer; immersing the substrate having the first patterned layer into a predetermined solution to form a third layer selectively on the exposed portions of the first layer; removing the first patterned layer; and etching the first layer using the third layer as a mask.

BRIEF DESCRIPTION OF THE DRAWINGS

The accompanying drawings, which are incorporated in and constitute a part of the specification, illustrate embodiments of the invention, and, together with the description, serve to explain the principles of the invention. Referring now to the drawings, like reference characters designate like or corresponding parts throughout the several views. Of the drawings:

FIG. 1 is a cross sectional view for explaining a problem in a conventional process.

FIGS. 2A and 2B are drawings for explaining another conventional process and the problem inherent therein.

FIG. 3A to 3D are cross sectional views for explaining a first embodiment of the present invention.

DETAILED DESCRIPTION OF THE INVENTION

Figure 4A:
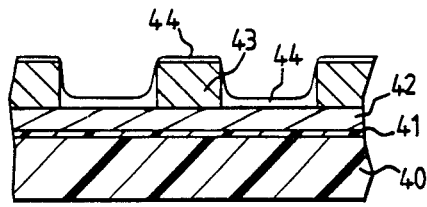
FIGS. 4A to 4D are cross sectional views for explaining a second embodiment of the present invention.

Referring now to the drawings, the present invention will be explained in detail.

FIGS. 3A to 3D are cross sectional views for explaining a first embodiment of the present invention, which allows formation of a wiring pattern at a recessed portion of a semiconductor substrate.

At first, a semiconductor substrate 30 having a recessed portion or dent 34 is prepared. Then, a tungsten silicide layer 31 to be patterned is formed on the substrate 31. Next, a positive photoresist layer, e.g., an OFPR (manufactured by Tokyo Oka Co.), is formed over the entire surface, and a photoresist pattern 33a and 33b covering a wall 32 at the dent 34 is formed using a conventional exposure and development technique. (FIG. 3A)

Next, the substrate 30 is immersed into a silicofluoride aqueous solution. In this step, a silicon oxide (SiO2) layer 35 of about 1000 Å is selectively formed at the area where the tungsten silicide (WSi) layer 31 is exposed, since the H2SiF6 and H2O react to precipitate SiO2. To selectively form the SiO2 layer, the surface of the photoresist layer 33a and 33b are subjected to, e.g., an oxygen plasma, to change the surface thereof from a hydrophilic condition (having, e.g., —OH radical as an end radical) to a hydrophobic condition (having, e.g., —0 radical as an end radical), preferably. (FIG. 3B) This process is referred to as a hydrophobic treatment hereafter.

Then, the photoresist pattern 33a and 33b are removed by, e.g., and ashing. (FIG. 3C)

Next, an anisotropic etching, such as a RIE, is carried out to form a desired WSi wiring layer 31a, 31b and 31c using the SiO2 layer 35 as a mask. (FIG. 3D) Then, an etching for removing the SiO2 layer 35 follows thereafter. (not shown)

According to this process, the wall 32 at the dent 34 is not exposed. Thus, the problem due to the light reflection from the surface 32 can be prevented. Furthermore, the etching selectivity between the WSi and the SiO2 is relatively high. Therefore, it is possible to obtain a desired pattern of WSi wiring 31a on the substrate 30, even if the substrate 30 includes a recessed portion, since the SiO2 layer 35 having a relatively low etching rate is used as a mask to etch the WSi layer 31.

It is, of course, possible to use other materials for the wiring layer, as one of orcinary skill in this art will realize.

FIGS. 4A to 4D are cross sectional views for explaining a second embodiment of the present invention. On a semiconductor substrate 40, a thermal oxide layer 41 is formed. On the oxide layer 41, an aluminium layer (A1) 42 of about 8000 Å to be etched is formed by, e.g., sputtering. Then, a patterned photoresist pattern 43 of about 12,000 Å is formed on the A1 layer 42 using a conventional exposure and development technique. Next, a glass layer 44 is formed by a Spin on Glass (SOG) method following a baking treatment. (FIG. 4A) Then, a conventional etching process is carried out to remove the relatively thin glass layer formed on the photoresist 43, and to leave a portion of the relatively thick glass layer 44 formed where the photoresist layer 43 is not formed. Next, a hydrophobic treatment is carried out.

Figure 4B:
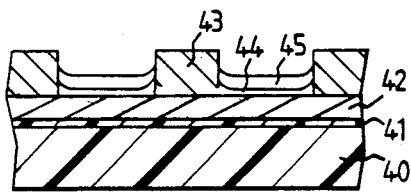

Then, the substrate is immersed into a silicofluoride aqueous solution to form a SiO2 pattern 45 of about 2000 Å on the glass layer 44, selectively. (FIG. 4B)

Figure 4C:
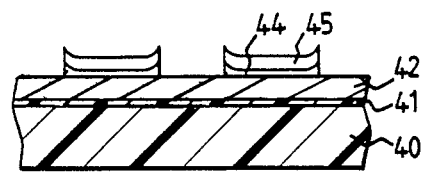
Figure 4D:
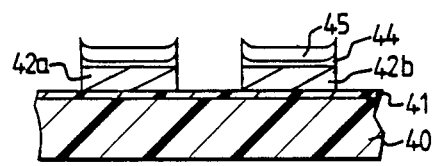

Next, the photoresist pattern 43 is removed by, e.g., a wet etching. (FIG. 4C)

Then, an anisotropic etching, e.g., a RIE, is carried out to form a desired A1 wiring layer 42a and 42b using the SiO2 pattern 45 as a mask. (FIG. 4D) Then, an etching for removing the SiO2 layer 45 and the glass layer 44 is carried out (not shown).

In this process, the etching selectivity between the A1 layer and the SiO2 layer is about 10, and is relatively large compared with that of between the A1 layer and the photoresist layer, namely about 2. Thus, the selectivity of the etching can be improved. Furthermore, the remaining A1 pattern 42a and 42b is determined by the SiO2 layer 45. The area where the SiO2 layer is formed is determined by the remaining photoresist layer 43. Thus, the narrower the photoresist pattern 43 becomes, the wider the A1 pattern 42a and 42b becomes. It is easy to make the remaining photoresist pattern narrower by controlling the exposing condition, e.g. by an over exposure, since the photoresist is a positive photoresist. This means that the width between the adjacent patterns can be made narrower, and the resolution can be improved.

In this process, the glass layer 44 serves to protect the A1 layer 42 from etching during the immersion of the substrate into the solution for precipitating the SiO2 layer 42.

Figure 5A:
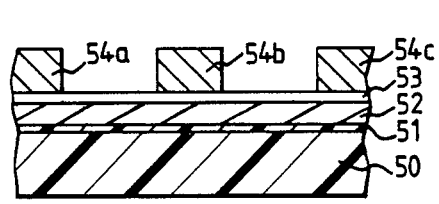
FIGS. 5A to 5E are cross sectional views for explaining a third embodiment of the present invention.

FIGS. 5A to 5E are drawings for explaining a third embodiment according to the present invention. On a semiconductor substrate 50, a thermal oxide layer 51 is formed. On the oxide layer 51, a aluminium layer (A1) 52 of about 8,000 Å to be etched is formed by, e.g., a sputtering. Then, a glass layer 53 is formed by a Spin on Glass method following a baking treatment. Then, a patterned photoresist layer 54a, 54b and 54c is formed using a conventional exposure and development technique. (FIG. 5A)

Figure 5B:
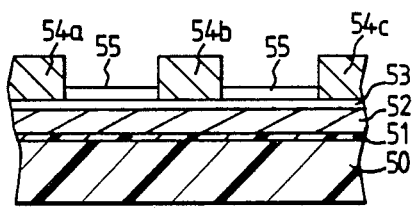

After a hydrophobic treatment of the photoresist pattern 54a, 54b, and 54c the substrate is immersed into a silicofluoride aqueous solution to form a SiO2 layer 55. (FIG. 5B)

Figure 5C:
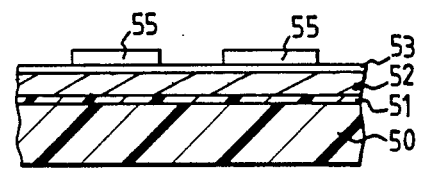

Then, the resist layer 54a, 54b, and 54c is removed. (FIG. 5C)

Figure 5D:
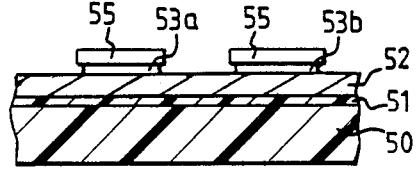
Figure 5E:
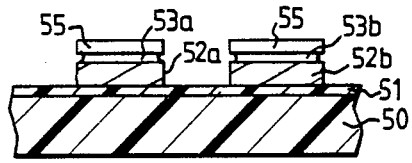

Next, an etching, e.g., a wet etching, is carried out to etch the glass layer 53 using the SiO2 layer 55 as a mask. (FIG. 5D)

Then, an anisotropic etching, e.g., a RIE etching, is carried out to form a desired A1 wiring layer 52a and 52b using the SiO2 layer 55 as a mask. (FIG. 5E) Then, the glass layer 53 and the SiO2 layer 55 are removed (not shown). Using this process, a desired wiring pattern can be achieved, as in the embodiment illustrated in FIGS. 4A to 4D.

FIGS. 6A to 6D are drawings for explaining a fourth embodiment for forming a contact hole in a semiconductor device. On a semiconductor substrate 60, and insulating layer 61 is formed. Then, a polysilicon layer 62 of about 300 Å is formed on the insulating layer by, e.g., a low pressure CVD method. Next, a patterned photoresist layer 63 is formed on the polysilicon layer 62 using a conventional exposure and development technique. (FIG. 6A) Then, a hydrophobic treatment of the photoresist layer 63 is carried out.

Figure 6A:
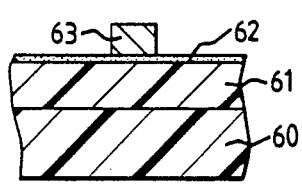
FIGS. 6A to 6D are cross sectional views for explaining a fourth embodiment of the present invention.
Figure 6B:
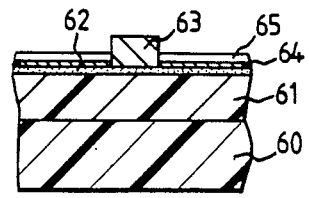

Next, the substrate is immersed into a solution of palladium chloride (PbC12) to form a palladium layer 64 of less than 100 Å using a electroless plating method. Next, the substrate is immersed into a mixed solution of nickel sulfate (NiSO4) and hypophosphite to form a nickel layer 65 of about 1000 Å. (FIG. 6B)

Figure 6C:
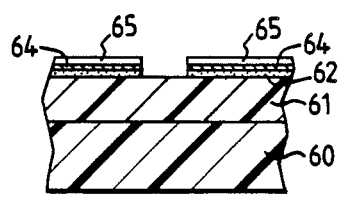

Next, the photoresist layer 63 is removed by, e.g., an ashing treatment using an oxygen plasma. (FIG. 6C)

Figure 6D:
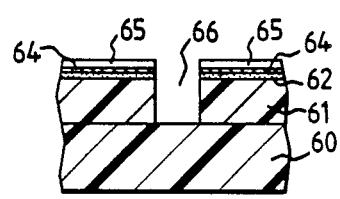

Then, an anisotropic etching, e.g., a RIE, is carried out to form a contact hole 66 using the nickel layer 65 as a mask. (FIG. 6D)

Next, the nickel layer 65 and the palladium layer 64 are removed (not shown) by a wet etching using a mixed etchant of a hydrochloric acid, a nitric acid and an acetic acid. The polysilicon layer 62 may either be removed by a wet etching using an organic alkali solution, e.g., a choline or a dry etching using a fluorine as an active radical, or it may be oxidized and left as it is.

In this embodiment, the size of the contact hole 66 is determined by the remaining photoresist pattern 63. Thus, by narrowing the size of the photoresist layer 63 using, e.g., an over exposure, it is possible to form a resist pattern having a narrower width than the resolution limit. Thus, it is possible to form a narrower contact hole than when the conventional etching process is used. Furthermore, the etching rate of the nickel layer 65 is extremely smaller than that of the insulating layer 61. Thus, a desired fine contact hole can be formed easily. The palladium layer 64 provides a good adhesion between the polysilicon layer 62 and the nickel 65.

Figure 7A:
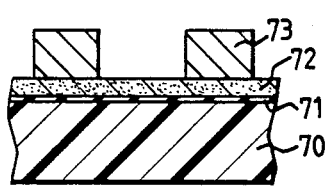
FIGS. 7A to 7D are cross sectional views for explaining a fifth embodiment of the present invention.

FIGS. 7A to 7D are drawings for explaining a fifth embodiment for oxidizing a semiconductor substrate 70. On a semiconductor substrate 70, a thermal insulating layer 71 is formed. Then, a silicon nitride layer 72 is formed on the insulating layer 71. Next, on the silicon nitride layer 72, a patterned photoresist layer 73 is formed. (FIG. 7A)

Figure 7B:
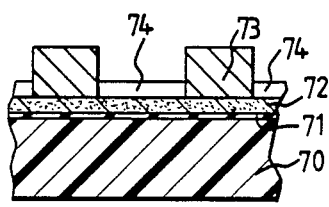

After a hydrophobic treatment of the photoresist layer 73, the substrate is immersed into the same solution, in the same way, as the embodiment of FIGS. 3A to 3D, to form a SiO2 layer 74. (FIG. 7B)

Figure 7C:
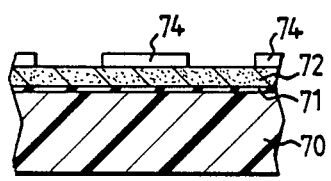
Figure 7D:
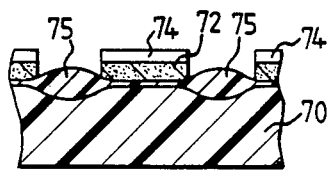

Next, the photoresist layer 73 is removed by, e.g., ashing using an oxygen plasma. (FIG. 7C)

Then, the silicon nitride layer 72 is selectively etched by using the SiO2 layer 74 as a mask. An oxidizing treatment is then carried out to oxidize the substrate 70 to form a device separating oxide layer 75, using the silicon nitride layer 72 selectively remaining under the SiO2 layer 74 as a mask layer. (FIG. 7D) Next, an etching treatment, e.g., a Chemical Dry Etching (CDE) is carried out to remove the SiO2 layer 74 (not shown) and the silicon nitride layer 72.

In the first, the second, the third and fifth embodiments, a SiO2 layer formed by a precipitation is used as a mask layer. However, it is possible to use a nickel layer formed by an non-electrical plating process, as used in the fourth embodiment, as a mask layer, and vice versa. Thus, in each embodiment, either a SiO2 layer or a nickel layer may be used as the mask layer.

Furthermore, it is possible to etch the semiconductor substrate instead of the wiring layer and the insulating layer.

Moreover, it is possible to utilize the present invention to form a pattern on an optical disk for storing a information.

In the aforementioned embodiments, a photoresist layer is used for the pattern formation. However, any film layer can be used as long as the layer permits little or no precipitation of substances thereon during immersion.

The present invention has been described with respect to specific embodiments. However, other embodiments based on fthe principles of the present invention should be obvious to those of ordinary skill in the art. Such embodiments are intended to be covered by the claims.

What is claimed is:

1. A method for forming a prescribed pattern, comprising the steps of:
    preparing a substrate having a first main surface configured with a recessed portion;
    forming a first layer covering the first main surface including the recessed portion;
    forming a second layer on the first layer;
    selectively removing the second layer to form a first patterned layer;
    immersing the substrate having the first patterned layer into a predetermined solution to form a third layer selectively on the exposed portions of the first layer;
    removing the first patterned layer; and
    etching the first layer using the third layer as a mask.

2. A method for forming a prescribed pattern, comprising the steps of:
    preparing a substrate having a first main surface;
    forming a first layer on the first main surface, said first layer being a metal layer;
    forming a second layer on the first layer, said second layer being a photoresist layer;
    selectively removing the second layer to form a first patterned layer;
    immersing the substrate having the first patterned layer into a predetermined solution to form a third layer selectively on the exposed portions of the first layer, said third layer being a glass layer;
    removing the first pattern layer; and etching the first layer using the third layer as a mask.

3. The method according to claim 2, wherein the third layer is formed by a Spin on Glass method.

4. The method according to claim 1, further comprising a step of forming a fourth layer over the layer before the formation of the second layer, and etching the fourth layer using the third layer as a mask.

5. The method according to claim 1, wherein the second layer is formed of hydrophilic material, and comprises a step of converting the second layer to a hydrophobic material before the immersion of the substrate.

6. A method for forming a prescribed pattern, comprising the steps of:
    preparing a semiconductor substrate having a first main surface;
    forming a first layer on the first main surface said first layer being a hydrophilic material;
    selectively removing the first layer to form a first patterned layer;
    converting the first patterned layer into a hydrophobic material;
    immersing the substrate having the first patterned layer into p predetermined solution to form a second layer selectively on those portions of the first main surface where the first layer has been removed;
    removing the first patterned layer; and
    etching the substrate using the second layer as a mask.

7. A method for forming a prescribed pattern, comprising the steps of:
    preparing a substrate having a first main surface;
    forming a first layer on the first main surface;
    forming a second layer on the first layer;
    forming a third layer on the second layer;
    selectively removing the third layer to form a first patterned layer;
    immersing the substrate having the first patterned layer into a predetermined solution to form a fourth layer selectively on the exposed portion of the second layer;
    removing the first patterned layer;
    etching the second layer using the fourth layer as a mask; and
    oxidizing the substrate to convert the first layer into an oxidized layer, using the fourth layer as a mask.

* * * * *